(12) United States Patent
Rhodes

(10) Patent No.: US 7,755,119 B2
(45) Date of Patent: Jul. 13, 2010

(54) METHOD AND APPARATUS FOR REDUCING IMAGER FLOATING DIFFUSION LEAKAGE

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 548 days.

(21) Appl. No.: 11/433,383

(22) Filed: May 15, 2006

(65) Prior Publication Data

US 2006/0214201 A1    Sep. 28, 2006

Related U.S. Application Data

(63) Continuation of application No. 10/752,555, filed on Jan. 8, 2004, now Pat. No. 7,071,505.

(51) Int. Cl.
*H01L 31/062* (2006.01)
(52) U.S. Cl. ............................... 257/292; 257/E27.132
(58) Field of Classification Search ................. 257/222, 257/223, 225, 291, 290, 443, 461, 462, 292, 257/E27.132
See application file for complete search history.

(56) References Cited

U.S. PATENT DOCUMENTS

| | | | |
|---|---|---|---|
| 5,780,912 A * | 7/1998 | Burr et al. | 257/408 |
| 6,140,630 A | 10/2000 | Rhodes | |
| 6,188,093 B1 * | 2/2001 | Isogai et al. | 257/230 |
| 6,204,524 B1 * | 3/2001 | Rhodes | 257/222 |
| 6,310,366 B1 | 10/2001 | Rhodes et al. | |
| 6,326,652 B1 * | 12/2001 | Rhodes | 257/231 |
| 6,333,205 B1 | 12/2001 | Rhodes | |
| 6,376,868 B1 | 4/2002 | Rhodes | |
| 2004/0099886 A1 | 5/2004 | Rhodes et al. | |

* cited by examiner

*Primary Examiner*—David Vu
(74) *Attorney, Agent, or Firm*—Dickstein Shapiro LLP

(57) ABSTRACT

An imager having reduced floating diffusion leakage and a mechanism for improving the storing of collected charge is described. A polysilicon contact is provided between a floating diffusion region and a gate of a source follower output transistor, with the contact also electrically connected to a storage capacitor. The storage capacitor provides additional charge storage capacity to the floating diffusion region. In addition, an associated reset transistor has different dopant characteristics in the source and drain regions. The floating diffusion region may be used in the pixels of a CMOS imager or in the output stage of a CCD imager.

11 Claims, 18 Drawing Sheets

US 7,755,119 B2

METHOD AND APPARATUS FOR REDUCING IMAGER FLOATING DIFFUSION LEAKAGE

CROSS REFERENCE TO RELATED APPLICATIONS

The present application is a continuation application of U.S. patent application Ser. No. 10/752,555, filed on Jan. 8, 2004, now U.S. Pat. No. 7,071,505 the disclosure of which is herewith incorporated by reference in its entirety.

FIELD OF THE INVENTION

The invention relates generally to a method and apparatus for reducing charge leakage in an imaging device.

BACKGROUND OF THE INVENTION

Typically, a digital imager circuit includes a focal plane array of pixel cells, each one of the cells including a photo-conversion device, e.g. a photogate, a photoconductor, or a photodiode. In a CMOS imager, a readout circuit connected to each pixel cell typically includes at least an output transistor. The photoconversion device converts photons to electrons which are typically transferred to a floating diffusion (FD) region, connected to the gate of a source follower output transistor. A charge transfer device can be included as well and may be a transistor for transferring charge from the photoconversion device to the floating diffusion region. Imager cells also typically have a transistor for resetting the floating diffusion region to a predetermined charge level prior to charge transference. The output of the source follower transistor is gated as an output signal by a row select transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing are hereby incorporated by reference herein in their entirety.

FIG. 1 illustrates a block diagram of a CMOS imager device 308 having a pixel array 200 containing a plurality of pixels arranged in rows and columns. The pixels of each row in array 200 are all turned on at the same time by a row select line, and the pixels of each column are selectively output by respective column select lines. The row lines are selectively activated by a row driver 210 in response to row address decoder 220. The column select lines are selectively activated by a column selector 260 in response to column address decoder 270. The pixel array is operated by the timing and control circuit 250, which controls address decoders 220, 270 for selecting the appropriate row and column lines for pixel signal readout. The pixel column signals, which typically include a pixel reset signal ($V_{rst}$) and a pixel image signal ($V_{sig}$), are read by a sample and hold circuit 261 associated with the column selector 260. A differential signal ($V_{rst}-V_{sig}$) is produced by differential amplifier 262 for each pixel which is amplified and digitized by analog to digital converter 275 (ADC). The analog to digital converter 275 supplies the digitized pixel signals to an image processor 280, which forms a digital image.

Each pixel of array 200 has a photosensor, e.g. a photogate, photodiode or other photoconversion element for generating electron/hole pairs in response to incident light. The generated electrons are collected in an n-type region of the photosensor. Photo charge may be amplified when it moves from the initial charge accumulation region to the floating diffusion region and it may be transferred to the floating diffusion region via a transfer transistor. The charge at the floating diffusion region is typically converted to a pixel output voltage by the source follower transistor. A floating diffusion region is also used at the output stage of a CCD image sensor which receives transferred charges from photosensors of a pixel array.

One problem associated with imagers is the inability to fully store at a floating diffusion region all charge generated by a photosensor. In addition, the floating diffusion region typically loses some charge transferred to it. Such charge leakage can lead to poor signal to noise ratios, punch-through at a reset transistor gate used to reset the floating diffusion region to a known state prior to a charge transfer and poor dynamic range.

SUMMARY OF THE INVENTION

Embodiments of the present invention provide an imager having reduced floating diffusion leakage. A polysilicon contact is provided between a floating diffusion region and a gate of a source follower output transistor, with the contact also electrically connected to a storage capacitor. The storage capacitor provides additional charge storage capacity to the floating diffusion region. In addition, an associated reset transistor has different dopant characteristics in the source and drain regions. The floating diffusion region may be used in the pixels of a CMOS imager or in the output stage of a CCD imager.

BRIEF DESCRIPTION OF THE DRAWINGS

Additional features of the present invention will be apparent from the following detailed description and drawings which illustrate preferred embodiments of the invention, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. Additionally, processing steps described and their progression are exemplary of preferred embodiments of the invention; however, the sequence of steps is not limited to that set forth herein and may be changed as is know in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photoconversion device for converting electromagnetic radiation to an electrical signal and to accompanying transistors, which operate the pixel. For purposes of illustration, a representative pixel is illustrated in the figures and description herein, and typically fabrication of all pixels of a similar type in an imager will proceed simultaneously in a similar fashion.

Although described in relation to the pixels of a CMOS image sensor, the invention is also applicable to analogous structures employing a floating diffusion region and associated reset and output transistor at the output stage of a Charge Coupled Device (CCD). The following detailed description is not to be taken in a limiting sense, and the scope of the present invention is defined by the appended claims.

Figure 2:
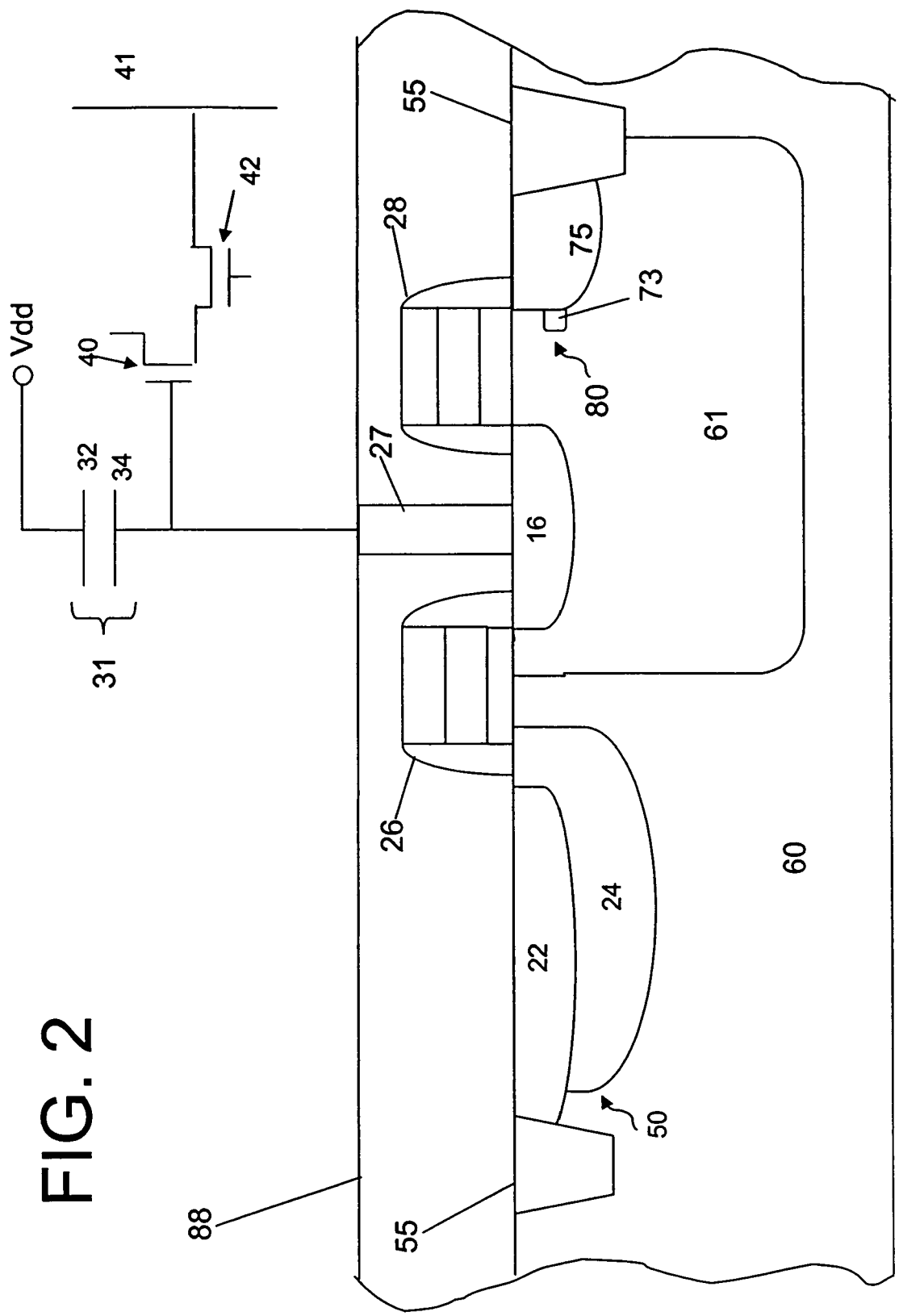
FIG. 2 is a cross-sectional view of an exemplary pixel sensor cell constructed according to an embodiment of the invention.

Now referring to the figures, where like reference numbers designate like elements, FIG. 2 illustrates an exemplary pixel sensor cell constructed in accordance with a first embodiment of the invention. A photoconversion device 50 is formed in a p-type substrate 60 having a higher doped p-type well 61. The photoconversion device 50 in this exemplary embodiment is a photodiode and may be a p-n junction photodiode, a Schottky photodiode, or any other suitable photodiode. The exemplary photodiode 50, as shown in FIG. 2, has a p-type region 22 and an n-type region 24 within p-type substrate 60.

The remaining structures shown in FIG. 2 include a transfer transistor with associated gate 26 and a reset transistor with associated gate 28. Floating diffusion region 16, source/drain region 80 and shallow trench isolation (STI) regions 55 are also shown. An exemplary n-type polysilicon non-self-aligned contact 27 is shown connected to the floating diffusion region 16 and serves to transfer charge received from the photoconversion device 50 to a storage capacitor 31. The storage capacitor 31 in FIG. 2 may be a planar plate capacitor. The storage capacitor 31 has first electrode 34, and a second electrode 32, with a dielectric layer formed therebetween. Second electrode 32 is preferably connected to a potential source, illustrated as Vdd.

The contact 27 is also connected to a gate of a source follower transistor 40. A row select transistor 42 with associated gate is also shown for gating the output of source follower transistor 40 onto an array column line 41. While the source follower transistor 40 and row select transistor 42 are illustrated in FIG. 2 in circuit form above substrate 60, it should be understood that these transistors are typically formed within pixel area of the substrate 60 in a similar fashion as transistors 26 and 28.

Although shown in FIG. 2 as a 4-transistor (4T) configuration with a transfer transistor having gate 26, the invention can also be utilized in a 3-transistor (3T) configuration, without a transfer transistor, and in other pixel configurations having a higher or lower number of transistors.

The floating diffusion region 16 is on one side of a transfer gate 26 opposite the photodiode 50. The reset transistor includes the floating diffusion region 16 on one side of reset gate 26 and a source/drain region 80 on the other side. The source/drain region 80 has different dopant characteristics compared with that of floating diffusion region 16 as discussed in more detail below.

FIGS. 3-16 show one exemplary method of forming the pixel sensor cell of FIG. 2, at various stages of formation. For convenience, the same cross-sectional view of FIG. 2 is utilized in FIGS. 3-16 for the ensuing description, and the source follower and row select transistors have been omitted for clarity from FIGS. 3-16.

Figure 3:
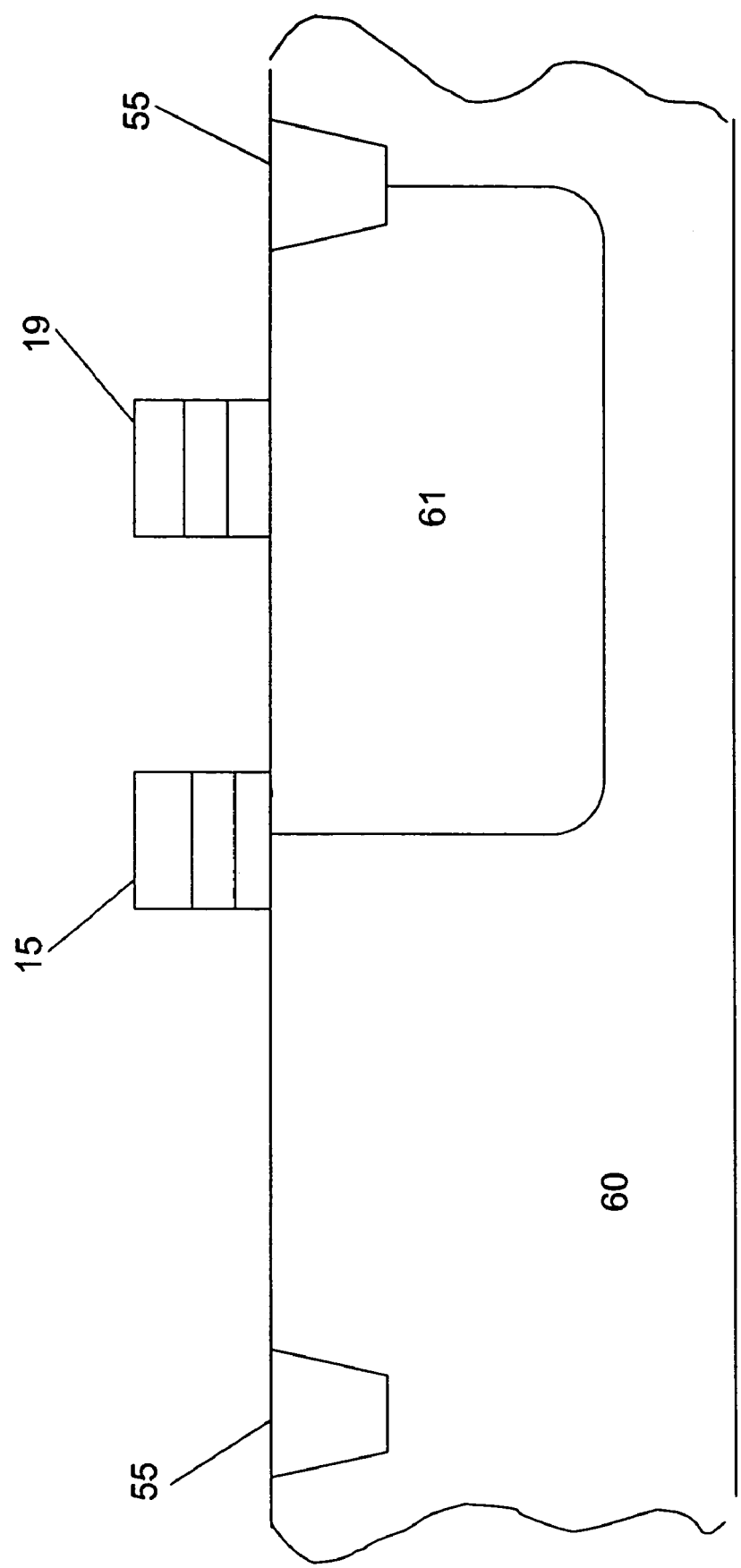
FIG. 3 shows a cross-sectional view of a portion of the FIG. 2 pixel during a stage of processing performed in accordance with an embodiment of the invention.

First a substrate 60, which is shown in FIG. 3 for exemplary purposes as a p-type silicon substrate, is formed. Isolation regions 55 are formed to electrically isolate regions of the substrate 60 where pixel cells will later be formed. The isolation regions 55, can be formed by any known technique such as thermal oxidation of the underlying silicon in a LOCOS process, or by etching trenches and filling them with oxide in an STI (shallow trench isolation) process.

FIG. 3 also shows a transfer gate stack 15 and a reset gate stack 19, which are formed by well-known methods, e.g., blanket deposition of gate oxide, doped polysilicon, deposition of metal for a silicide, nitride annealing to form a silicide, then patterning and etching. It should be appreciated that the invention is not limited to a particular method of forming the transistor gate stacks 15, 19.

A p-type well 61 is also illustrated in FIG. 3. The p-well implant may be conducted so that the pixel array well 61 and a p-type periphery logic well, which contains logic circuits for controlling the array, have different doping profiles. As known in the art, multiple high energy implants may be used to tailor the profile of the p-type well 61. P-type well 61 has a higher doping concentration than p-type substrate 60.

Figure 4:
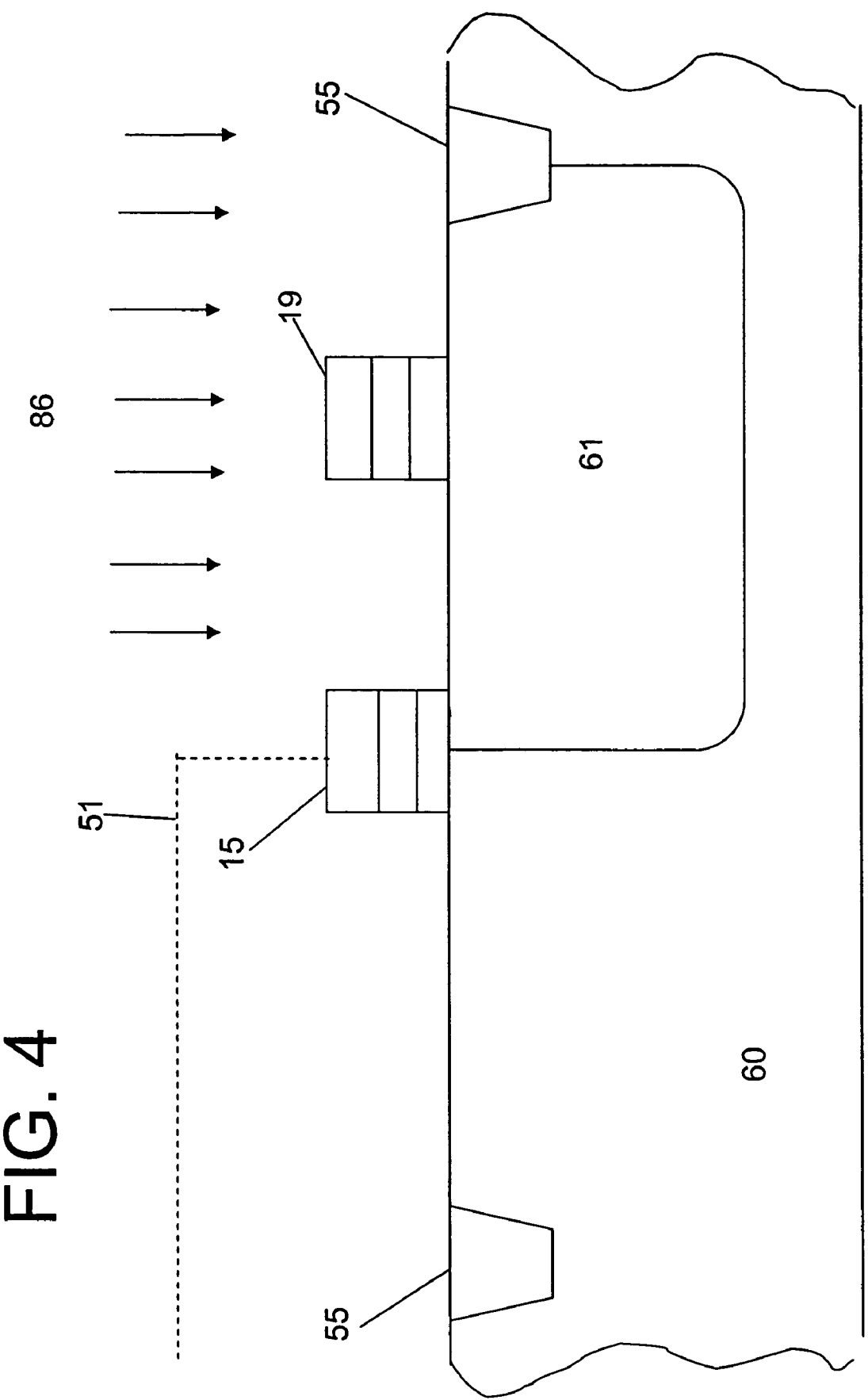
FIG. 4 shows a stage of processing subsequent to that shown in FIG. 3.
Figure 5:
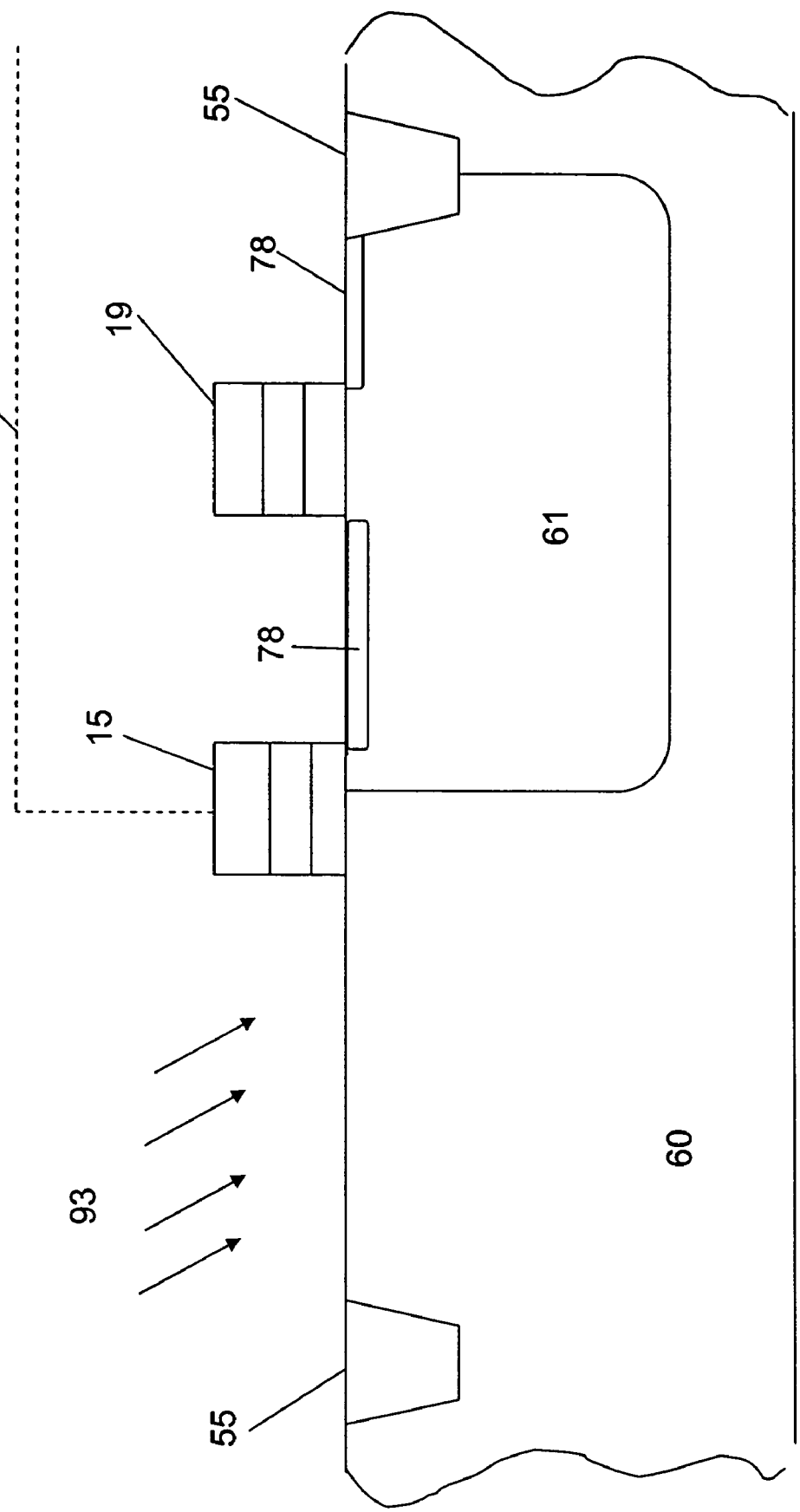
FIG. 5 shows a stage of processing subsequent to that shown in FIG. 4.

FIG. 4 shows a mask 51 placed over the substrate, blocking regions which will subsequently form the photodiode 50 and a portion of transfer gate stack 15. An n-type implant 86 is performed on exposed regions to create a lightly doped drain regions 78 (FIG. 5). Mask 51 is subsequently removed. FIG. 5 shows a mask 33 placed over the reset transistor gate stack 19 and a portion of the transfer transistor gate stack 15. An angled n-type implant 93 is conducted to form the n-type layer 24 (FIG. 6) of the photodiode 50. Mask 33 is subsequently removed. The dopant concentration in the n-type layer 24 is within the range of about $5 \times 10^{14}$ atoms per $cm^3$ to about $1 \times 10^{18}$ atoms per $cm^3$, and is preferably within the range of about $1 \times 10^{15}$ atoms per $cm^3$ to about $5 \times 10^{16}$ atoms per $cm^3$.

Figure 6:
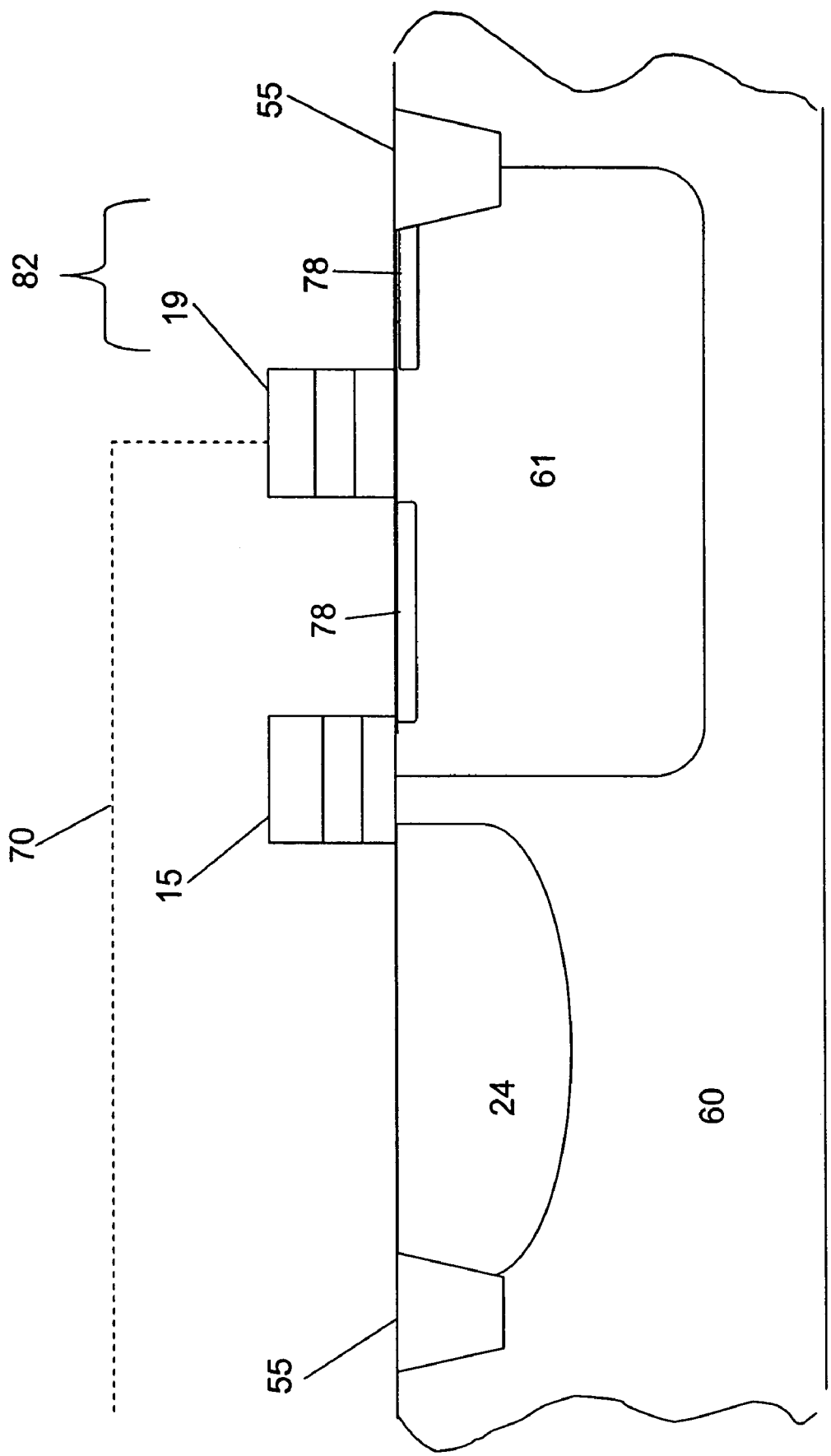
FIG. 6 shows a stage of processing subsequent to that shown in FIG. 5.
Figure 7:
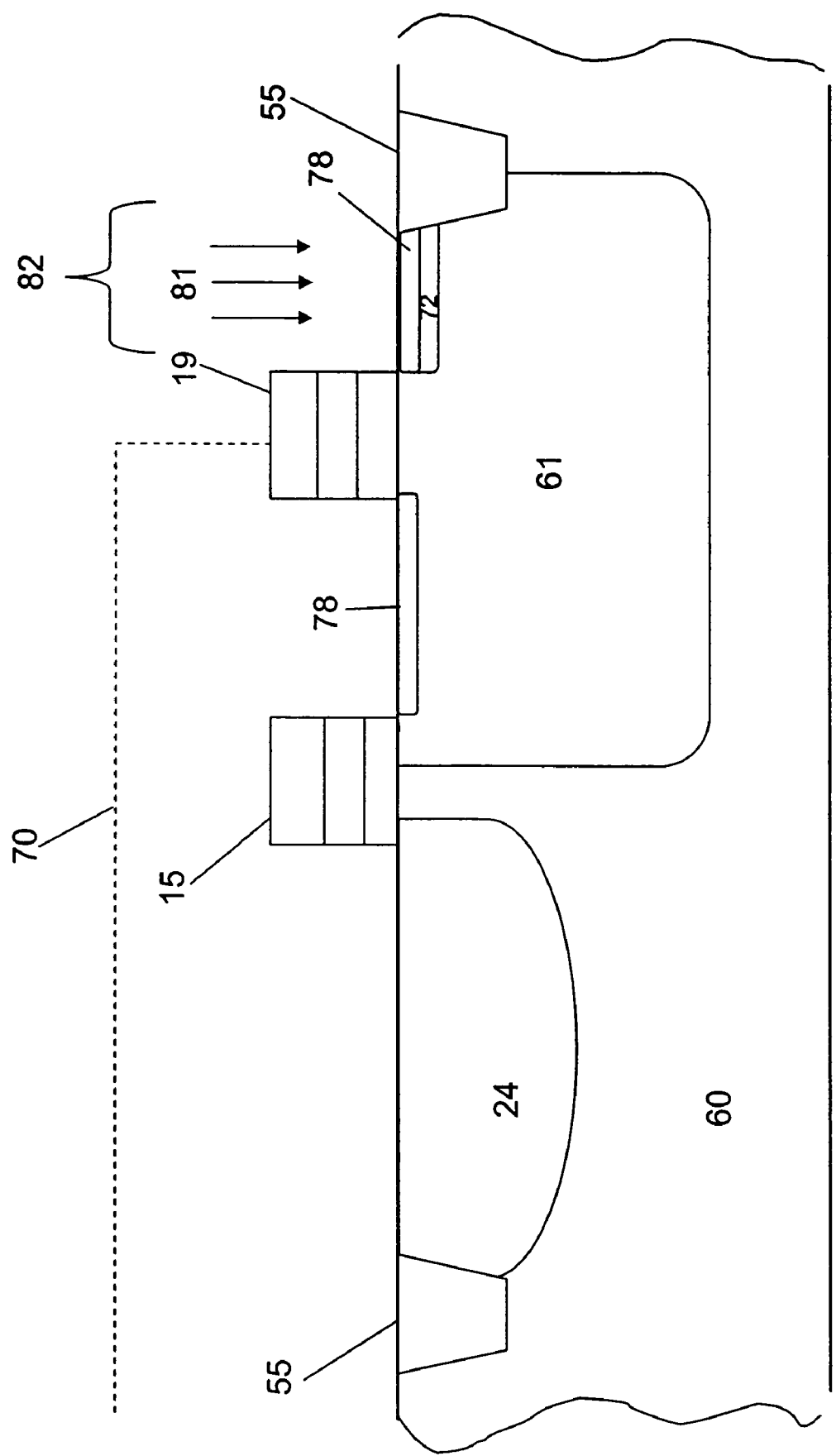
FIG. 7 shows a stage of processing subsequent to that shown in FIG. 6.

A mask 70 (FIG. 6) is formed over the substrate including gate stack 15 and over a portion of reset gate stack 19. Next as shown in FIG. 7, the structure of FIG. 6 is subjected to a first dopant implantation 81 with an n-type dopant in the area of the substrate 61 directly beneath the opening 82 to obtain an extended depth n-type region 72. Ion implantation is conducted to form n-type region 72 on only one side of the gate stack 19, as illustrated in FIG. 7. The n-type region 72 is self-aligned to the edge of the reset gate stack 19.

Subsequent to the masked dopant implantation 81, the structure of FIG. 7 is subjected to a second angled p-type dopant implantation 84 (FIG. 8) to form a p-type halo implanted region 73 located below the n-type region 72, and extending slightly below the gate stack 19. P-type dopants may be implanted within opening 82 at an angle "ø" with respect to the surface of the substrate 61 within a range of about 30 to about 60 degrees.

Figure 8:
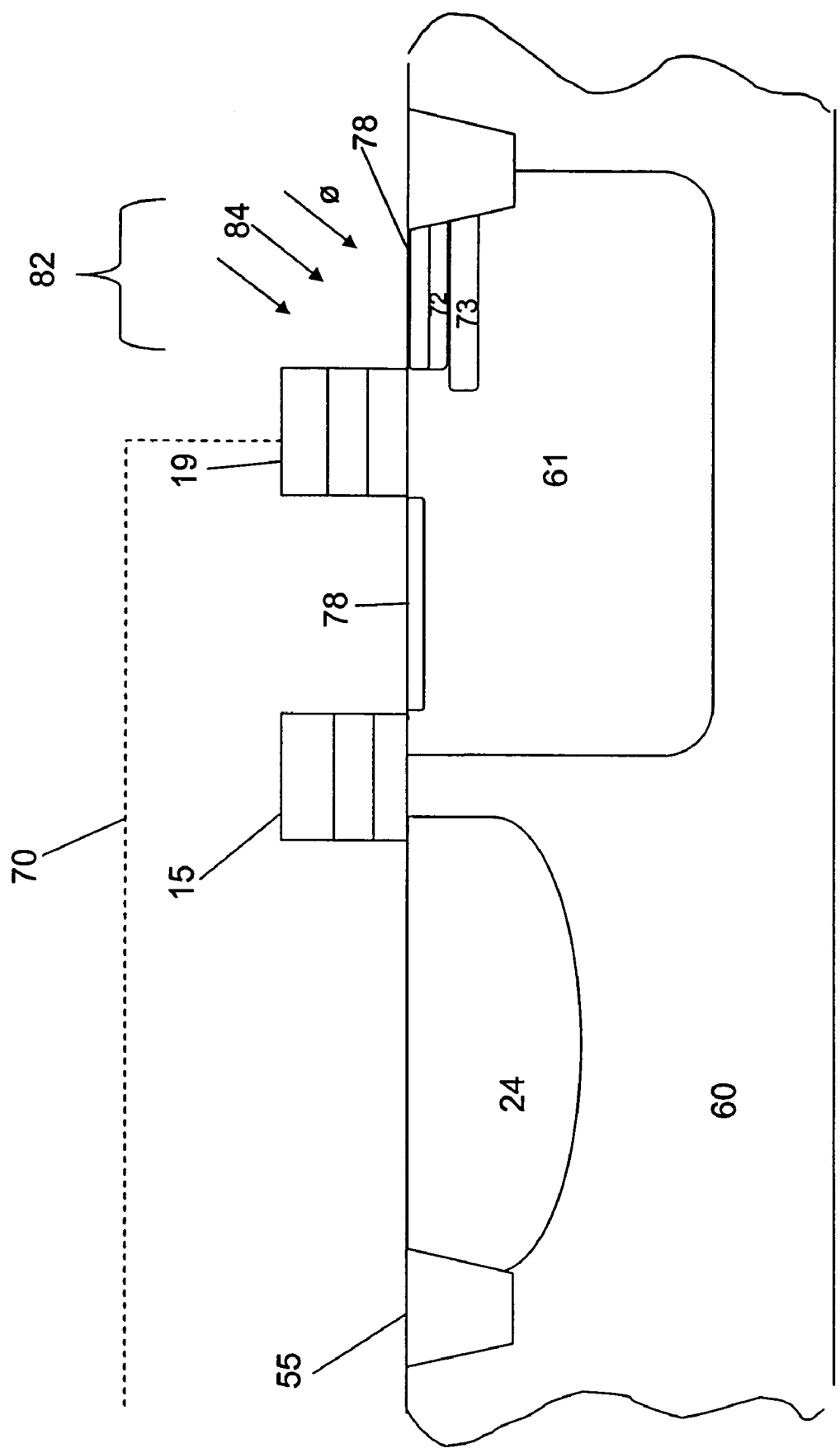
FIG. 8 shows a stage of processing subsequent to that shown in FIG. 7.
Figure 9:
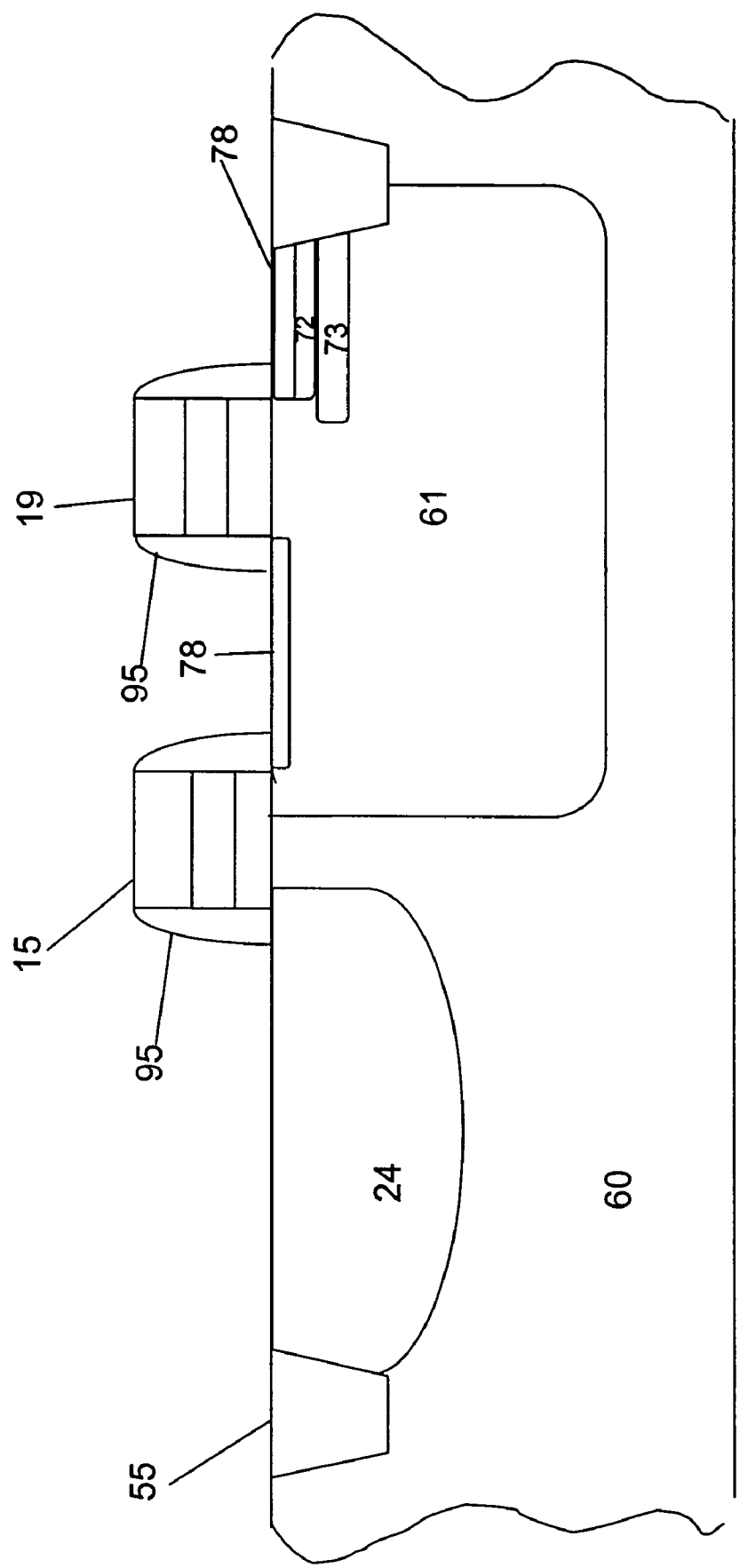
FIG. 9 shows a stage of processing subsequent to that shown in FIG. 8.

Subsequent to the formation of the p-type halo implanted region 73 of FIG. 8, insulating sidewall spacers 95 are then formed on both sides of the transfer gate stack 15 and reset gate stack 19 by methods known in the art, as illustrated in FIG. 9. The sidewall spacers may be formed, for example, of silicon dioxide, silicon nitride, silicon oxynitride, ON, NO, ONO or TEOS, among others.

Figure 10:
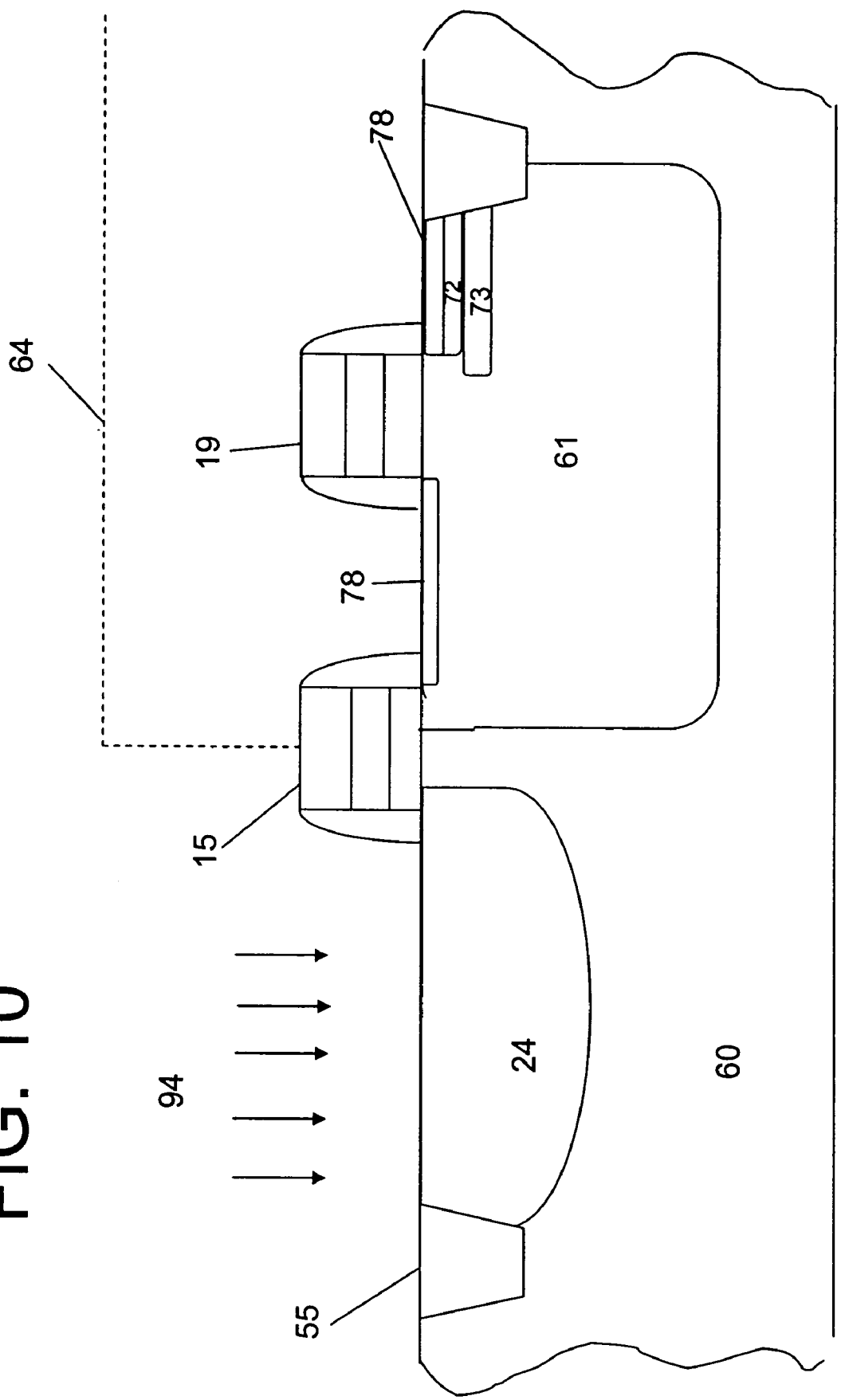
FIG. 10 shows a stage of processing subsequent to that shown in FIG. 9.

As shown in FIG. 10, a mask 64 is placed over the substrate and a p-type dopant implant 94 is conducted to form the overlying p-type layer 22 (FIG. 11) of the photodiode 50. The dopant concentration of the overlying layer 22 is within the range of $1 \times 10^{17}$ atoms per $cm^3$ to about $1 \times 10^{20}$ atoms per $cm^3$.

Figure 11:
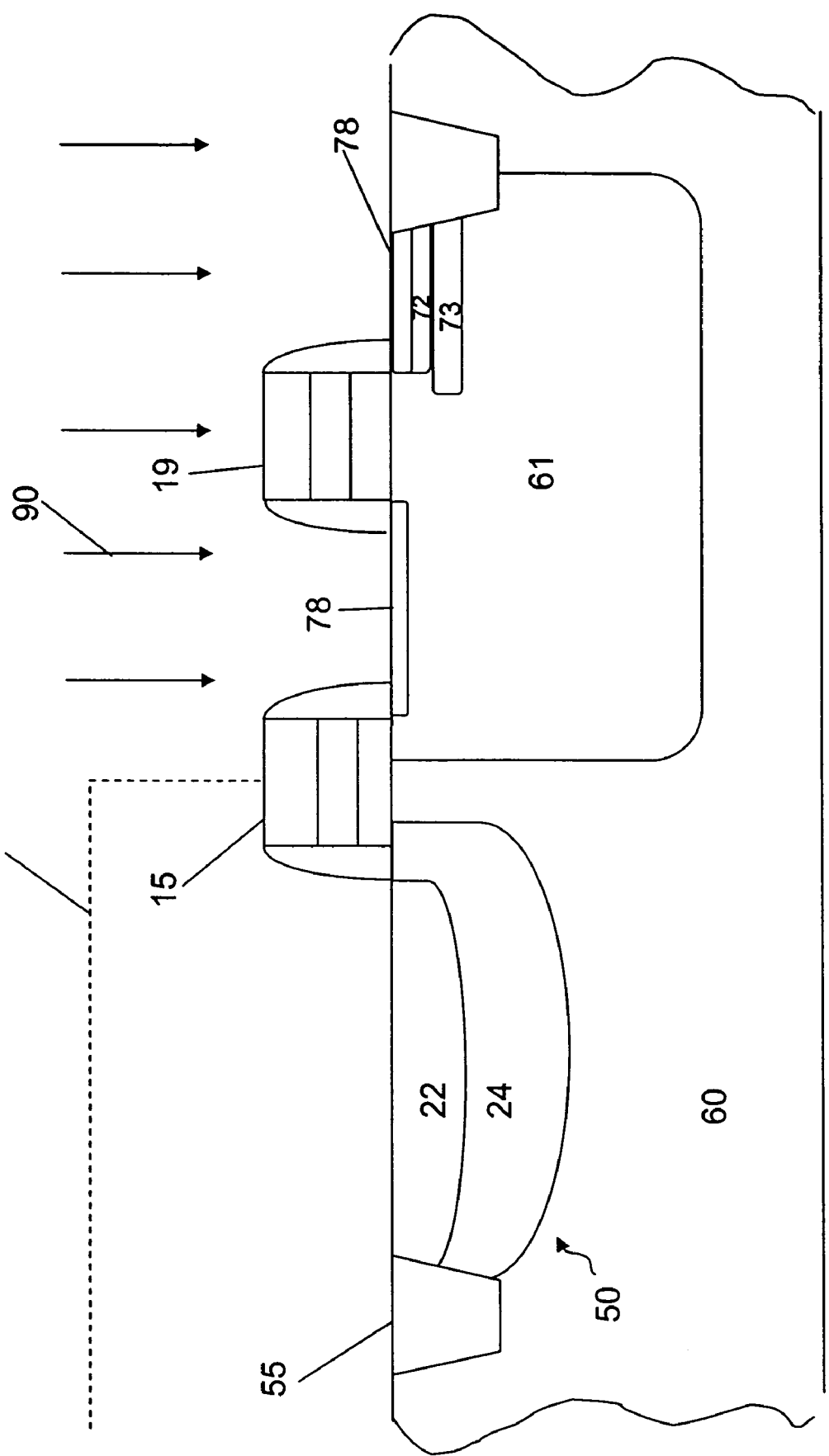
FIG. 11 shows a stage of processing subsequent to that shown in FIG. 10.
Figure 12:
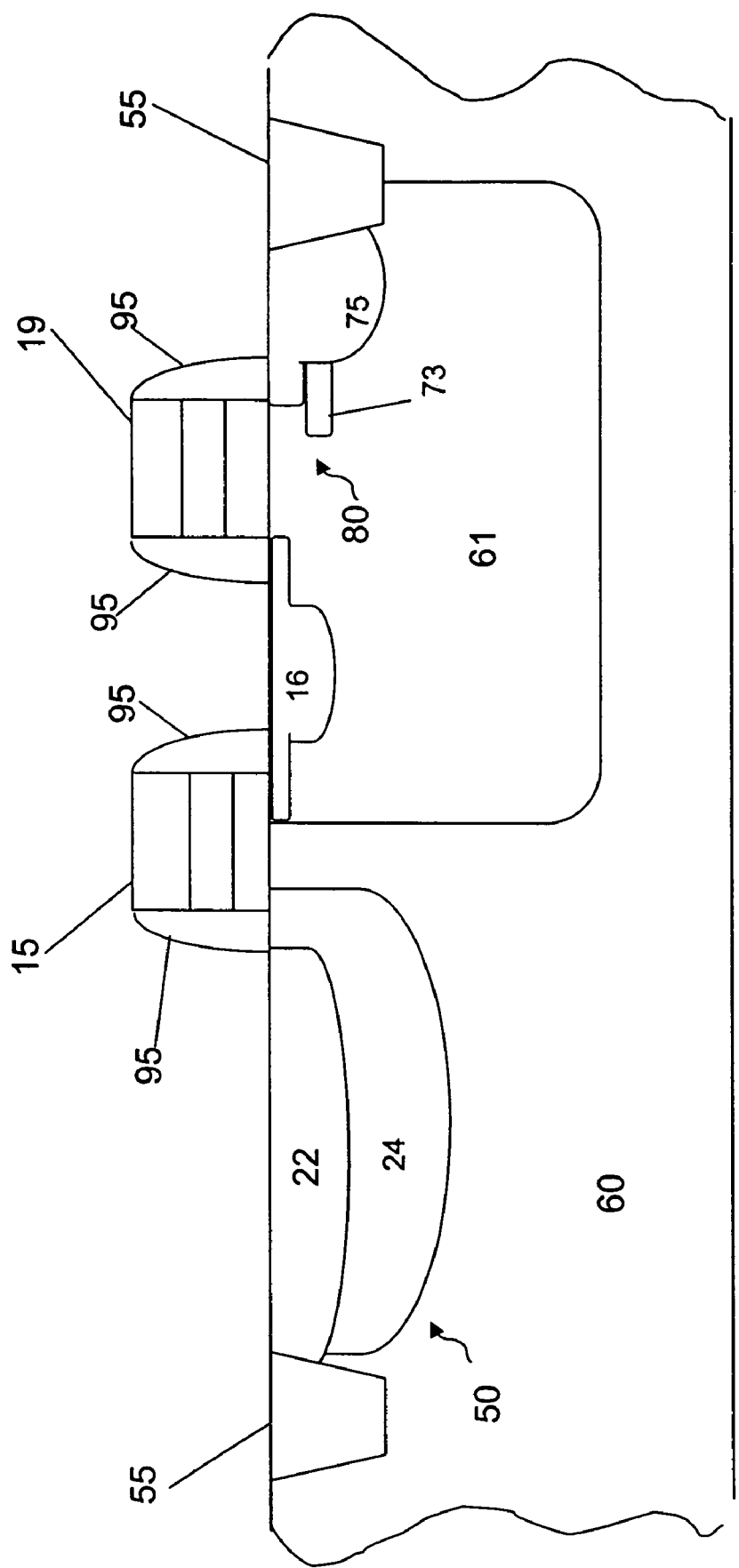
FIG. 12 shows a stage of processing subsequent to that shown in FIG. 11.

Next, FIG. 11 shows a mask 57 having an opening over p-well 61. A deep n-type implant 90 is conducted to form source/drain region 75 and floating diffusion region 16 on opposite sides of reset gate stack 19 which is now the gate 28 of the reset transistor (FIG. 2). The dopant concentration in the source/drain region 75 and floating diffusion region 16 is within the range of about $5 \times 10^{15}$ to about $1 \times 10^{17}$ atoms per $cm^3$, and is preferably within the range of about $1 \times 10^{16}$ atoms per $cm^3$. The implantation of the deep dopant implantation 90 causes the p-type region 73 to be diminished to only a portion protruding into the channel beneath gate stack 19, as shown in FIG. 12.

Figure 13:
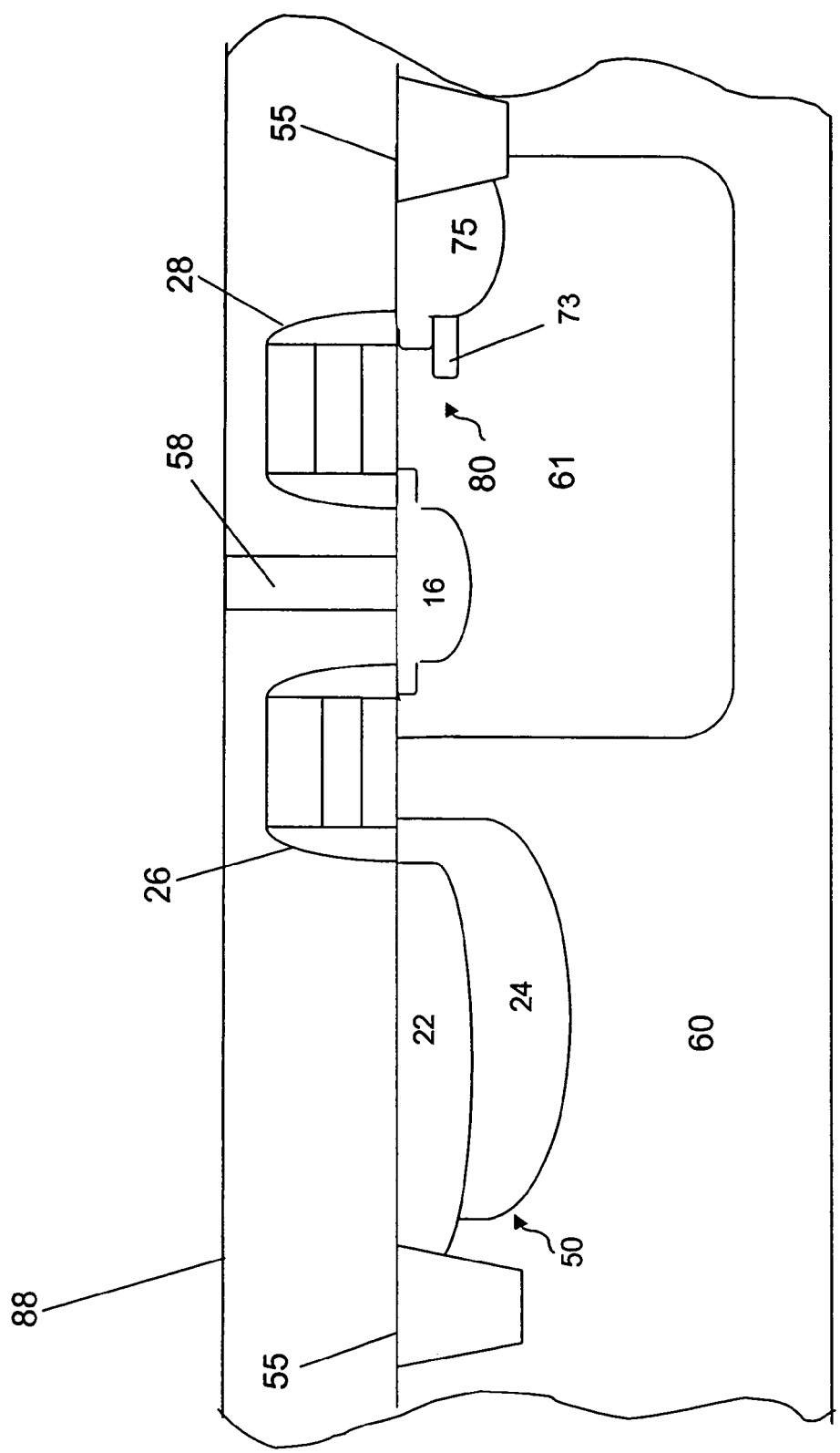
FIG. 13 shows a stage of processing subsequent to that shown in FIG. 12.

The entire surface is next covered with a passivation layer 88 of, for example, silicon dioxide, BSG, PSG, or BPSG, which is CMP planarized (FIG. 13). A mask (not shown) is applied to the insulating layer 88 and photolithographic techniques are used to define an area to be etched out to form a hole 58 for a contact 27 to the floating diffusion region 16. An n+ type dopant may be implanted within hole 58 at an upper portion of the floating diffusion region 16 in order to facilitate better ohmic contact with floating diffusion region 16.

The contact 27 may be formed in etched hole 58 by depositing therein a conductive material, such as n+ doped polysilicon, or a metal such as titanium, titanium nitride or tungsten on the surface of passivation layer 88 and within hole 58, which is then planarized leaving contact 27. After hole 58 has conductor 27 formed therein a first conductive layer 34 (FIG. 14), which forms a first electrode of the capacitor 31 (FIG. 2), is deposited over the insulating layer 88 and etched. The conductive layer 34 may be formed of any conductive material.

Figure 14:
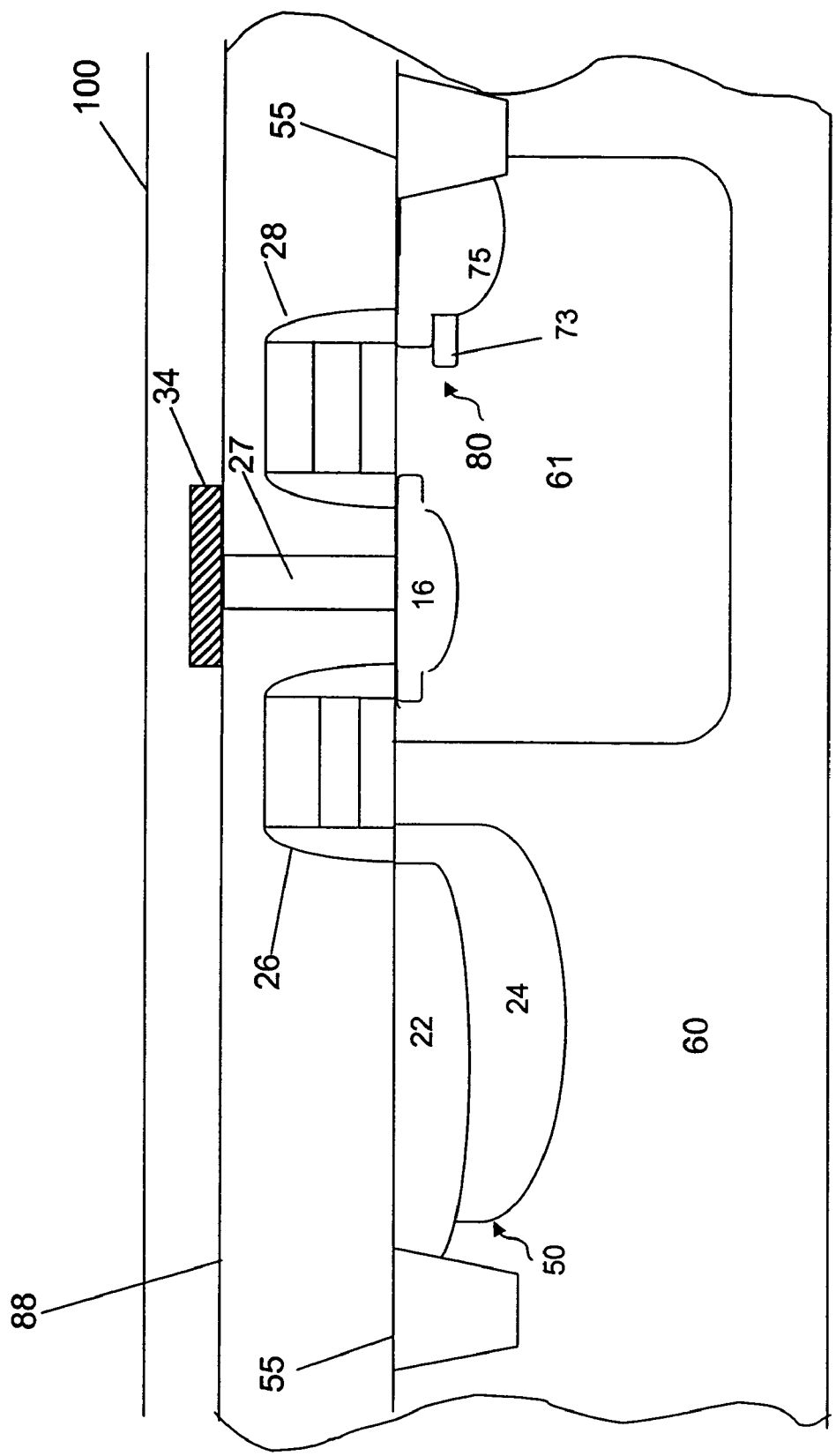
FIG. 14 shows a stage of processing subsequent to that shown in FIG. 13.

A dielectric layer 100, also illustrated in FIG. 14, is formed over layer 88 and conductive layer 34. The term dielectric or insulator as used herein shall be understood to mean any solid, liquid or gaseous material that can sustain an electrical field for use in the capacitor of an integrated circuit device.

Figure 15:
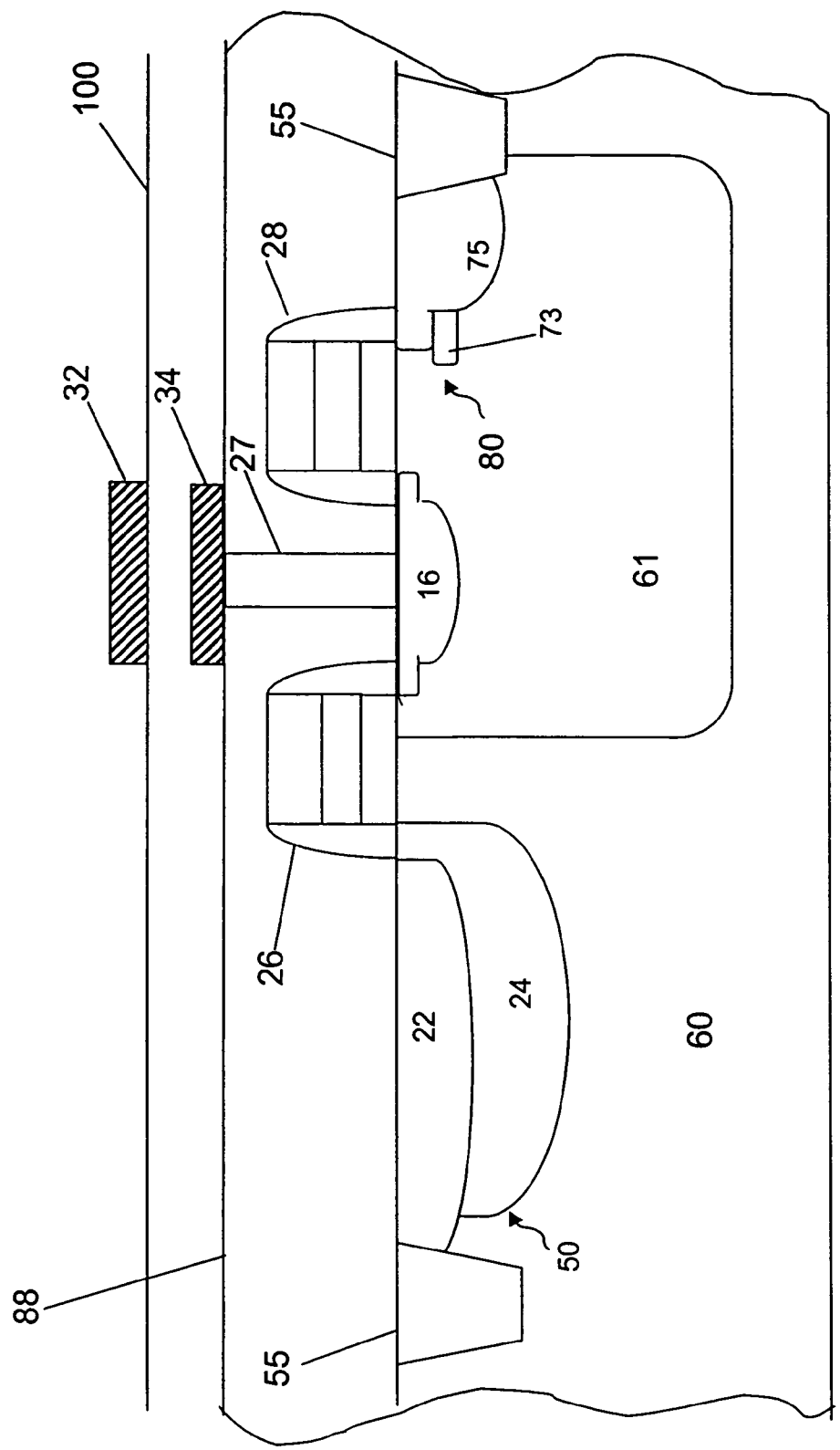
FIG. 15 shows a stage of processing subsequent to that shown in FIG. 14.
Figure 16:
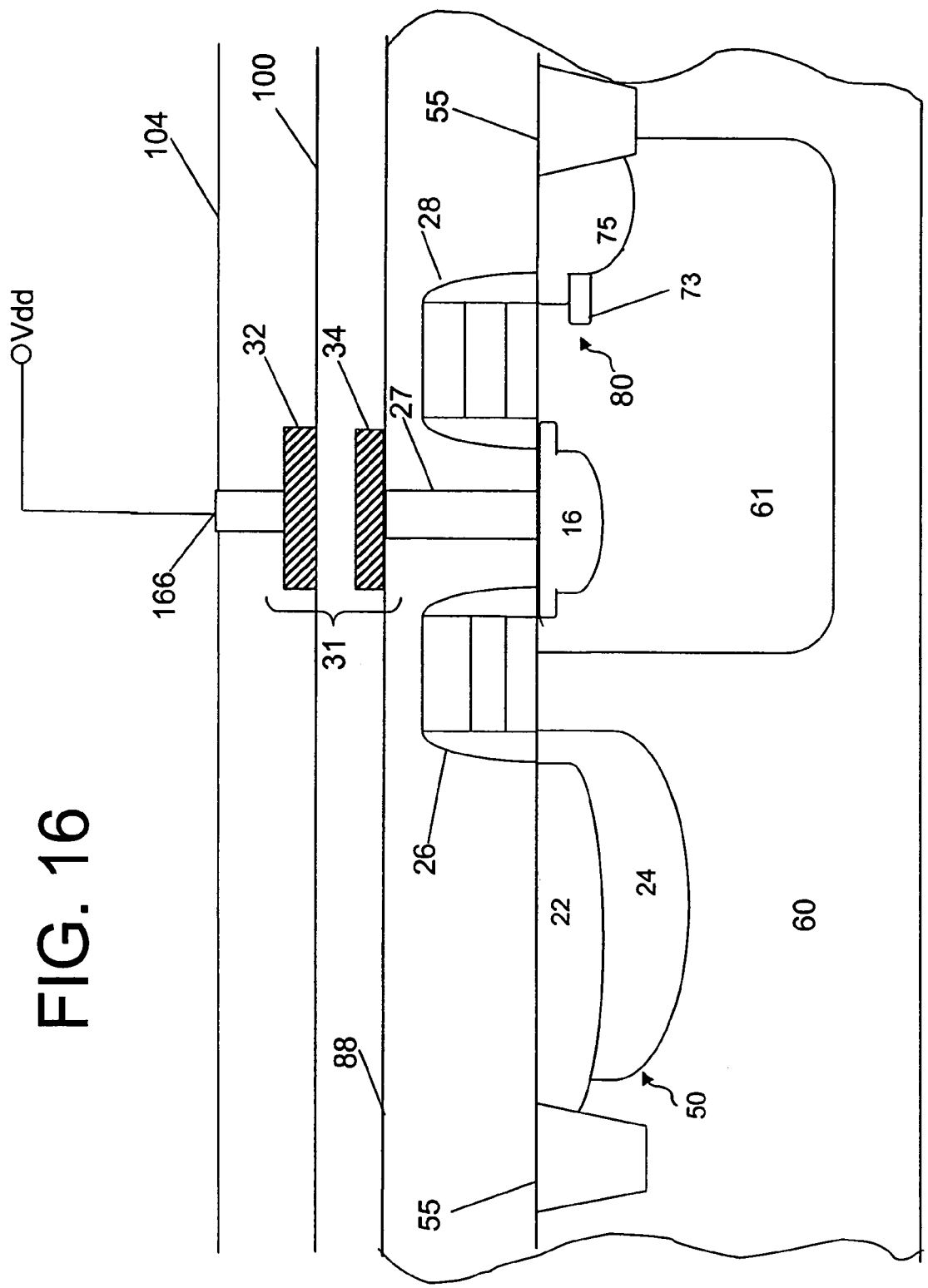
FIG. 16 shows a stage of processing subsequent to that shown in FIG. 15.

Referring now to FIG. 15, a second conductive layer 32, which forms the second electrode of the capacitor 31 (FIG. 2), is formed over dielectric layer 100 and patterned in a manner similar to that of the first conductive layer 34. The second conductive layer 32 may be formed of the same or different conductive materials from those used for the first conductive layer 34. Preferably, both the first and second conductive layers 32, 34 are formed of doped polysilicon and a nitride dielectric layer 100 is formed between the two conductive layers 34, 32. A passivation layer 104 is then deposited over the capacitor 31 as shown in FIG. 16. A hole is etched in the passivation layer 104 and a metal contact 166 is formed therein to connect the second electrode 32 of the capacitor 31 to a voltage source. Additional holes and contacts may be provided in passivation layer 88 to the gate of source follower transistor 40 (FIG. 2) and a metal formed on layer 88 to interconnect the gate of transistor 40 to conductive layer 34 and/or contact 27.

Figure 17:
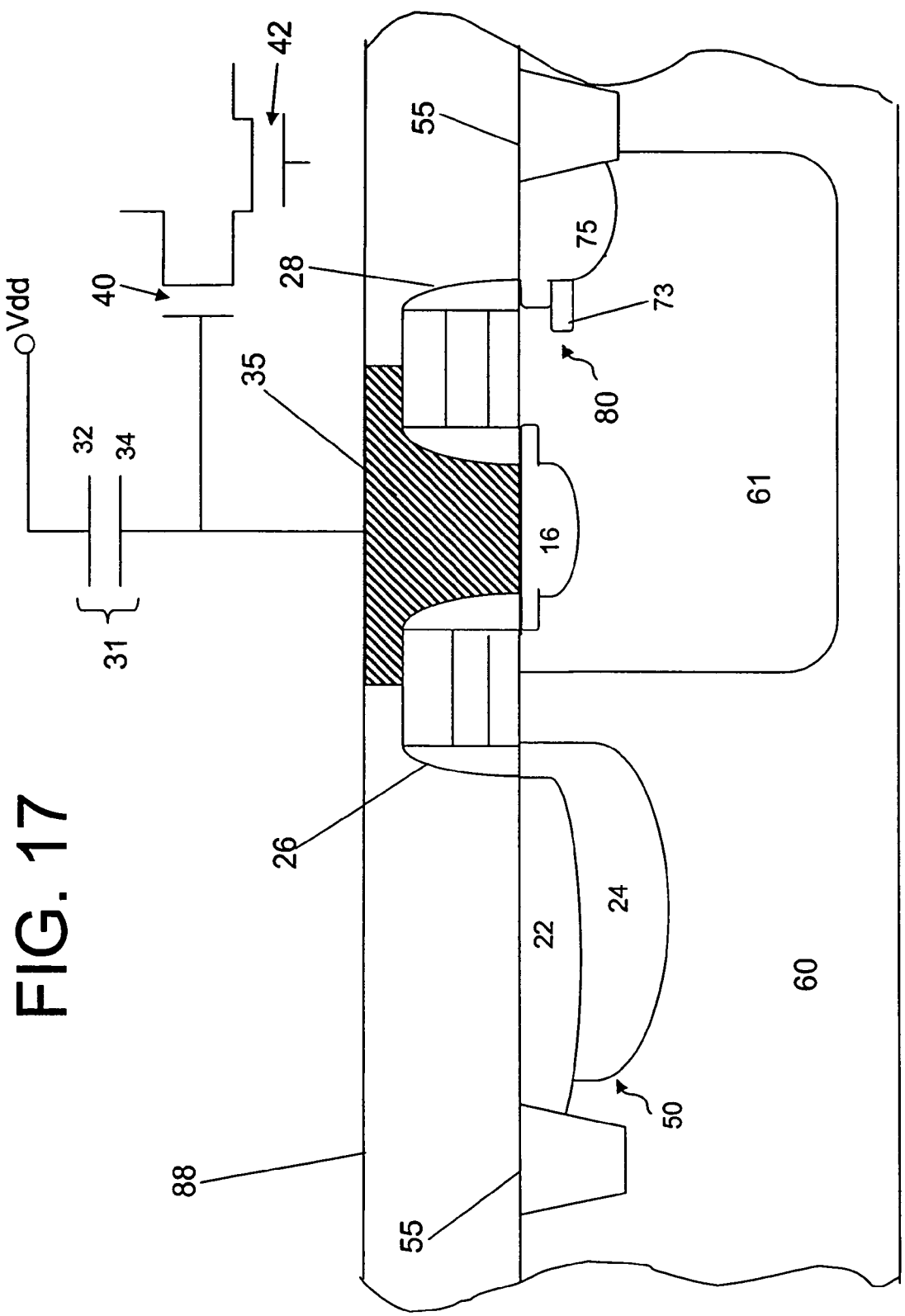
FIG. 17 shows another exemplary embodiment according to the invention.

FIG. 17 shows another embodiment of the invention where contact 35 is a self-aligned n+ polysilicon contact connecting the floating diffusion region 16 with the storage capacitor 31 and source follower transistor 40. Contact 35 is self-aligned between transfer transistor 26 and reset transistor 28, over floating diffusion region 16. All other aspects of the FIG. 17 embodiment are the same as the embodiment shown in FIG. 16.

The method of forming the embodiment shown in FIG. 17 is the same as that shown above in FIGS. 3-16, with the exception of the formation of the contact 35. In the FIG. 17 embodiment, contact 35 is self-aligned to the gates 26, 28. Selective etching is used to etch an opening in layer 88 between the transfer transistor gate 26 and reset transistor gate 28 where polysilicon is then deposited by conventional methods. The polysilicon is doped to an n+ conductivity.

Figure 1:
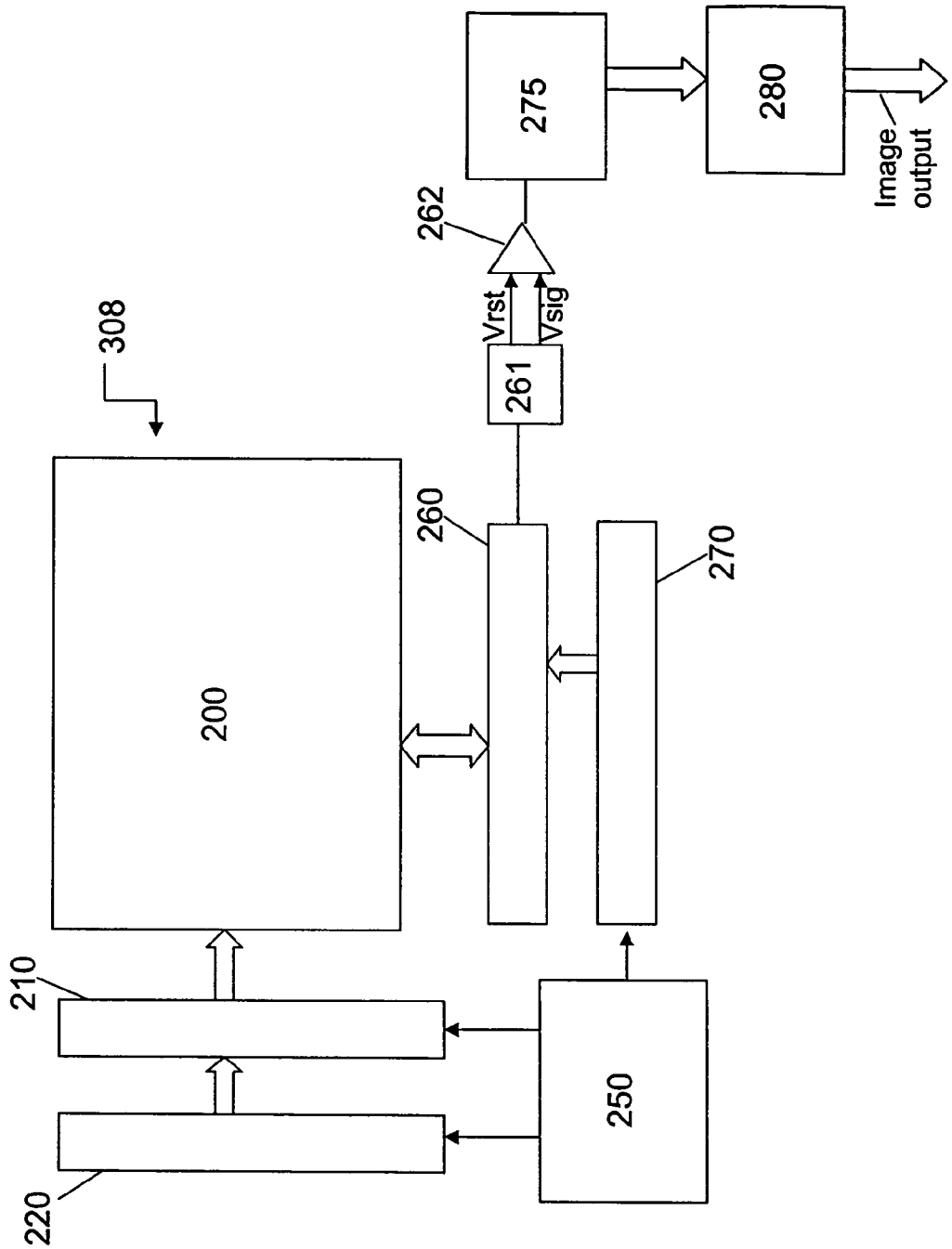
FIG. 1 is a block diagram of a conventional CMOS imager chip having a pixel array.
Figure 18:
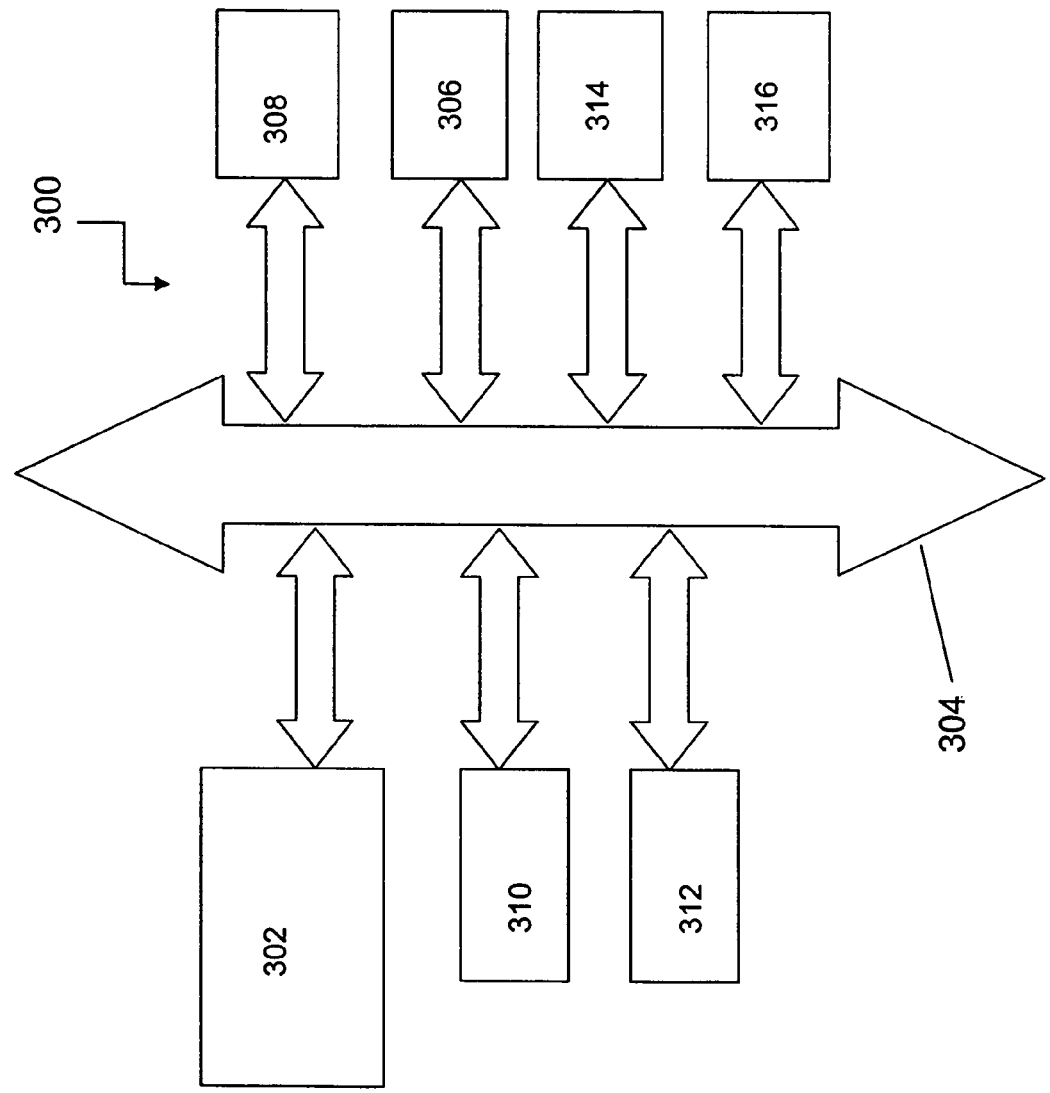
FIG. 18 is an embodiment of diagram of a processing system employing a CMOS imager constructed in accordance with the present invention.

The pixels of the invention (FIG. 2 and FIG. 17) can be used in an imager device 308 (FIG. 1). FIG. 18 shows a processor system 300, which includes an imager device 308 (FIG. 1) having a pixel array employing pixels constructed in accordance with the invention. System 300 includes a processor 302 having a central processing unit (CPU) that communicates with various devices over a bus 304. Some of the devices connected to the bus 304 provide communication into and out of the system 300; an input/output (I/O) device 306 and imager device 308 are such communication devices. Other devices connected to the bus 304 provide memory, illustratively including a random access memory (RAM) 310, hard drive 312, and one or more peripheral memory devices such as a floppy disk drive 314 and compact disk (CD) drive 316. The imager device 308 may be constructed as shown in FIG. 1 with the pixels of array 200 having the characteristics of the invention as described above in connection with FIGS. 2-16. The imager device 308 may, in turn, be coupled to processor 302 for image processing, or other image handling operations.

The processes and devices described above illustrate exemplary embodiments of the invention. Many modifications may be made which do not depart from the spirit and scope of the invention. For example, and as noted, although the invention has been described in the embodiment of a pixel sensor cell of a CMOS imager, the same techniques and structures for the floating diffusion region, contact and reset transistor may be employed in the output stage of a CCD imager. Accordingly, the above description and drawings are not considered as limiting the invention and the invention is limited solely by the scope of the appended claims. Any modifications, though presently unforeseeable, of the present invention that come within the spirit and scope of the following claims should be considered part of the present invention.

What is claimed as new and desired to be protected by Letters Patent of the United States is:

1. A pixel comprising:
    a floating diffusion region for receiving photo-generated charges from a photoconversion device, said floating diffusion region being of a first conductivity type;
    a transistor for transferring the photo-generated charges from the photoconversion device to the floating diffusion region, the transistor having said floating diffusion region as a source/drain region of said transistor;
    a polysilicon contact doped to said first conductivity type and located over and directly connected to said floating diffusion region; and
    a storage capacitor and a gate of a source follower transistor connected to said floating diffusion region through said polysilicon contact.

2. The pixel according to claim 1, wherein said polysilicon contact is a self-aligned contact.

3. The pixel according to claim 1, wherein said polysilicon contact is not a self-aligned contact.

4. The pixel according to claim 1, further comprising a reset transistor for resetting said floating diffusion region to a predetermined charge state.

5. A pixel comprising:
    a first transistor for transferring photo-generated charges from a photoconversion device to a floating diffusion region, said floating diffusion region being of a first conductivity type;
    a second transistor coupled to said floating diffusion region such that said floating diffusion region acts as a first source/drain region of said second transistor;
    a second source/drain region coupled to said second transistor, wherein said second source/drain region includes a first region of said first conductivity type and a second region of a second conductivity type;
    a polysilicon contact directly connected to said floating diffusion region, wherein said polysilicon contact is doped to said first conductivity type; and
    a storage capacitor and a gate of a source follower transistor connected to said floating diffusion region through said polysilicon contact.

6. The pixel according to claim 5, wherein said first conductivity type is n-type.

7. The pixel according to claim 5, wherein said second conductivity type is p-type.

8. The pixel according to claim 5, wherein a doping concentration of said first source/drain region is different from a doping concentration of said second source/drain region.

9. The pixel according to claim 5, wherein said second region of said second source/drain region extends into a channel region of said second transistor.

10. The pixel according to claim 5, wherein said polysilicon contact is a self-aligned contact.

11. The pixel according to claim 5, wherein said polysilicon contact is not a self-aligned contact.

* * * * *